United States Patent
Birgel et al.

(10) Patent No.: US 6,881,906 B2
(45) Date of Patent: Apr. 19, 2005

(54) PRINTED CIRCUIT BOARD COMPRISING A CONTACT SLEEVE THAT IS MOUNTED THEREON

(75) Inventors: Dietmar Birgel, Schopfheim (DE); Karl-Peter Hauptvogel, Bartenheim (FR); Wolfgang Brutschin, Schopfheim (DE); Alexander Müller, Steinen (DE)

(73) Assignee: Endress + Hauser GmbH + Co. KG, Maulburg (DE)

( * ) Notice: Subject to any disclaimer, the term of this patent is extended or adjusted under 35 U.S.C. 154(b) by 0 days.

(21) Appl. No.: 10/477,201
(22) PCT Filed: May 8, 2002
(86) PCT No.: PCT/EP02/05065
§ 371 (c)(1), (2), (4) Date: Nov. 17, 2003
(87) PCT Pub. No.: WO02/093992
PCT Pub. Date: Nov. 21, 2002

(65) Prior Publication Data
US 2004/0140123 A1 Jul. 22, 2004

(30) Foreign Application Priority Data
May 15, 2001 (DE) .......................... 101 23 684

(51) Int. Cl.[7] .............................................. H01R 12/04
(52) U.S. Cl. ....................... 174/261; 174/250; 343/906; 439/55

(58) Field of Search ................... 174/250, 261, 174/263; 343/700 MS, 702, 906; 439/55, 82, 247, 581, 916; 428/901

(56) References Cited

U.S. PATENT DOCUMENTS

| | | | |
|---|---|---|---|
| 4,431,253 A | * | 2/1984 | Hochgesang et al. ........ 439/675 |
| 4,505,531 A | | 3/1985 | Miller ....................... 339/64 R |
| 5,517,747 A | * | 5/1996 | Pierro et al. ................... 29/600 |
| 6,140,977 A | | 10/2000 | Morales et al. ............. 343/906 |

FOREIGN PATENT DOCUMENTS

| | | |
|---|---|---|
| DE | G 92 10 077.5 | 1/1994 |
| DE | 43 24 917 A1 | 3/1994 |
| DE | 198 36 456 C1 | 4/2000 |
| DE | 1 075 049 A1 | 7/2000 |

* cited by examiner

Primary Examiner—Tan Ho
(74) Attorney, Agent, or Firm—Bacon & Thomas, PLLC

(57) ABSTRACT

A circuit board with a contact sleeve mounted thereon. The contact sleeve is electrically connectable in the manner used for an SMD-component. An upper side of the circuit board has a recess and a metallizing bordering the recess, the metallizing being connected to a conductor path extending on the circuit board, and, set in the recess, a contact sleeve, which is both mechanically secured and electrically connected to the metallizing by means of a solder connection.

5 Claims, 2 Drawing Sheets

PRINTED CIRCUIT BOARD COMPRISING A CONTACT SLEEVE THAT IS MOUNTED THEREON

TECHNICAL FIELD

The invention relates to a circuit board, particularly a printed circuit board, with a contact sleeve mounted thereon.

BACKGROUND OF THE INVENTION

Contact sleeves are, as a rule, hollow metallic cylinders. They serve e.g. as sockets for banana plugs. It is, however, also possible to arrange a number of contact sleeves alongside one another, so that a plug with a corresponding number of plug contacts can be inserted.

Contact sleeves are usually, as illustrated in FIG. 1, placed in a bore 3 piercing a circuit board 1. The contact sleeves are connected with the circuit board 1 at their two ends by a solder connection 5, 7. A cylindrical inner surface of the bore 3 and annular disk-shaped regions bordering the ends of the bore are provided with metallizing 9. The solder connections 5, 7 create a mechanical securement of the contact sleeve 11 and an electrical connection between the contact sleeve 11 and the metallizing 9 of the circuit board 1. The metallizing 9 is electrically connected through at least one conductor path 13 on the circuit board.

Usually the circuit boards are manually provided with the contact sleeves and the solder connections are either also formed manually or else in a wave solder bath.

Modern electrical instruments, especially measurement instruments, contain, as a rule, at least one circuit board, on which the electronic components are arranged. These components must be secured mechanically on the circuit board and connected electrically to conductors running in or on the circuit board. To reduce the manufacturing costs, surface-mountable components, so-called "surface mounted devices", or, for short, SMD components, are preferably used. SMD components do not require holes in the circuit board for their mounting. Instead, they are soldered directly with their contacts onto connections provided for them.

Typically, in a first step, a solder paste is applied in a screen printing process onto the circuit board at all places where components are to be subsequently positioned. A place where solder is applied or where, after the end of the manufacturing process, a solder connection exists, is called a solder location in the following.

In a next step, the circuit boards are populated with the components by machine. The populated circuit boards are then brought into an oven, especially a reflow oven. The soldering process takes place in an oven, e.g. in a protective gas atmosphere, where a solder-specific temperature cycle is carried out.

Today, most electronic components are available as SMD-components, and this has led to a considerable reduction in the manufacturing costs of electronic instruments. Unfortunately, there are still some components that cannot be mounted and connected together with SMD-components in one procedure. The manual populating and connecting of these components results in a high, additional expense.

SUMMARY OF THE INVENTION

It is an object of the invention to provide a circuit board with a contact sleeve, where the contact sleeve is electrically connectable as an SMD-component.

To this end, the invention is comprised of a circuit board with
a recess provided on an upper side of the circuit board,
metallizing bordering the recess,
the metallizing being connected to a conductor path extending on the circuit board, and,
a contact sleeve set in the recess,
the contact sleeve being both mechanically secured and electrically connected to the metallizing by means of a solder connection.

In one embodiment, the recess is milled into the circuit board.

In a first embodiment, the metallizing is formed by copper pads bordering on the recess.

In a second embodiment, the metallizing is a metallic coating applied to the surface of the recess and an area adjacent thereto.

Additionally, the invention comprises a method for producing such a circuit board, in which method
solder is applied by machine onto the circuit board,
the contact sleeve is placed on the circuit board together with SMD-components with an automatic populating machine, and
the populated circuit board is brought into an oven, where the solder connections for the SMD-components and the contact sleeve are produced by the action of heat.

Because the contact sleeve is not, as usual in the prior art, placed through the circuit board, but, instead, is set into a recess on the surface of the circuit board, the sleeve can now be handled as an SMD-component. This means that it can be placed on the circuit board by machine. The solder thus is applied by machine concurrently with the solder for SMD-components, the circuit board is populated by machine complete with contact sleeves and SMD-components, and many circuit boards can be manufactured and fed into an oven on conveyer belts, in that many circuit boards are handled simultaneously. This results in considerable cost savings.

The invention and further advantages will now be explained in greater detail on the basis of the figures of the drawings, in which three examples of embodiments are illustrated; equal elements are provided with the same reference characters throughout the figures.

DESCRIPTION OF THE PREFERRED EMBODIMENTS

Figure 1:
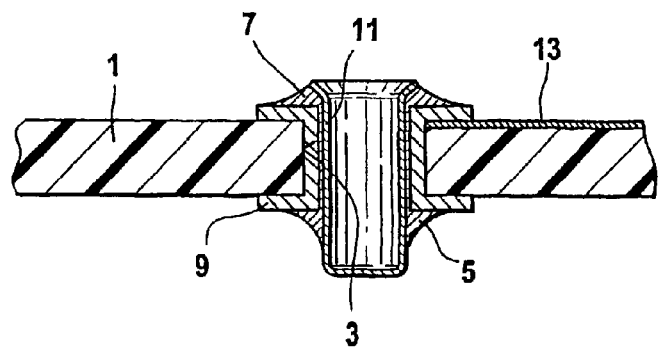
FIG. 1 shows schematically a circuit board with a contact sleeve of the prior art.
Figure 2:
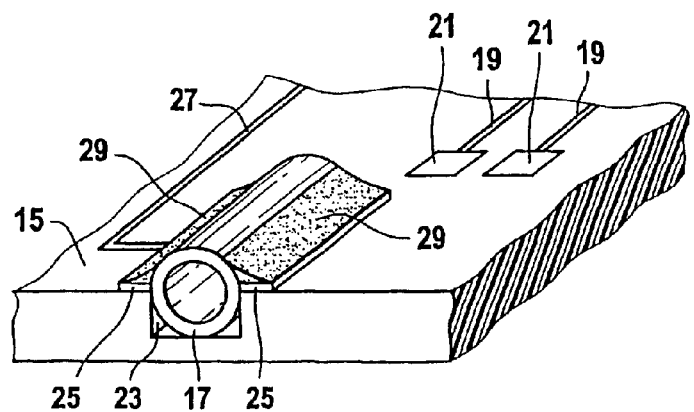
FIG. 2 shows schematically a circuit board with a contact sleeve applied and connected according to the invention, wherein the circuit board has a metallizing on both sides of a recess for the contact sleeve.

FIG. 2 shows schematically a circuit board 15 with a contact sleeve 17 applied and connected according to the invention.

Contact sleeve 17 is a hollow metallic cylinder and is made e.g. of copper.

Circuit board 15 is e.g. a usual commercially available, rigid circuit board, of e.g. an epoxy-resin-based insulating material. Conductor paths 19 of the circuit board 15 are usually of copper and, where a connection is to occur, they have exposed copper pads 21. FIG. 2 shows two copper pads 21 suitable, by way of example, for the connection of an SMD-component.

A pocket-shaped recess 23 is provided on the upper side of the circuit board 15. The pocket-shaped recess 23 is e.g. milled into the circuit board 15.

A metallizing 25 borders on the recess 23. The metallizing 25 can e.g. be copper pads placed on the circuit board 15 bordering on the recess 23. This is shown in FIG. 2.

Figure 3:
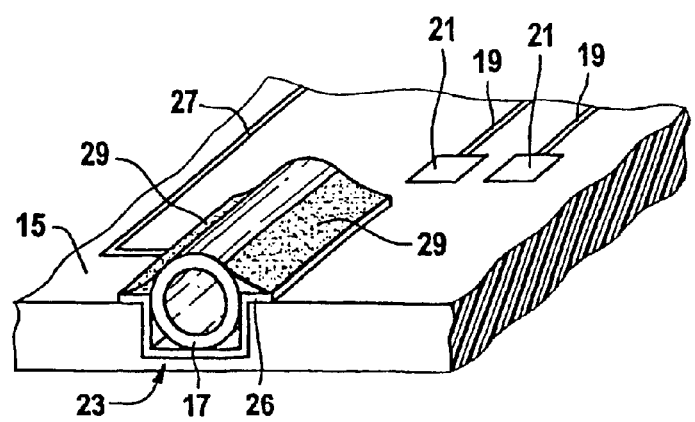
FIG. 3 shows schematically a circuit board with a contact sleeve applied and connected according to the invention, wherein the circuit board has a metallizing on both sides of a recess for the contact sleeve and also in the recess.

Also, the surface of the recess 23 and an area of the surface of the circuit board 15 adjacent thereto can be provided with a metallizing 26 in the form of a metallic coating. This embodiment is illustrated in FIG. 3. Except for the metallizing 26, the embodiment illustrated in FIG. 3 is identical to the embodiment illustrated in FIG. 2.

The metallizings 25, 26 are e.g. electrochemically or galvanically applied.

Connected to the metallizing 25, 26 is a conductor path 27 extending on the circuit board 15.

The contact sleeve 17 is set lengthwise in the recess 23 and both mechanically secured and electrically connected to the metallizing 25, 26 by means of a solder connection 29.

It is also possible to provide a connection metallizing on the copper pads 21 and the metallizing 25, 26. The connection metallizing is composed e.g. of a nickel layer and a gold layer. The nickel is applied galvanically, the gold chemically. In this case, the nickel layer is arranged between the copper pad 21 or the metallizing 25, as the case may be, and the gold layer. It serves as a diffusion barrier and prevents migration of copper into the gold layer. This type of surface improvement is often used in solder connections.

Alternatively, a hot air tinning can be performed to improve the soldering properties. For this, tin is placed on the surface of the copper pad, or the surface of the metallizing 25, as the case may be, and melted by means of hot air. The liquid tin forms a very flat surface, which is advantageous for the subsequent soldering process. This procedure is also referred to as Hot-Air-Leveling (HAL).

Contacts of usual commercially available SMD-components are made of a tin-lead alloy. Especially useful is a solder that has a silver content. Very good results are achieved with a tin-silver solder. The solder is advantageously lead free. Lead has a low melting point and contributes to the fact that, with lead-containing solders, stable connections are only achievable at low temperatures. A tin-lead solder exhibits a melting point of about 180° C., while in the case of tin-silver solder the melting point is about 220° C.

Such a circuit board 15 of the invention is preferably manufactured by machine. The solder is applied e.g. in the screen printing process by machine at the appropriate solder locations on the circuit board 15, here the copper pads 21 and the metallizing 25, 26. Then the circuit board 15 is populated by means of an automatic populating machine with all desired SMD-components and the contact sleeve 17. Naturally, a plurality of contact sleeves 17 can also be provided on the circuit board.

Due to the concept of the invention, the contact sleeve 17 can be handled like an SMD-component.

A component can be handled like an SMD-component when all contacts that are to be connected on a circuit board are located on one side of the component and contact flat surfaces. Consequently, the populating and the connecting of the circuit board 15 with the contact sleeve 17 can proceed by machine in mass production.

Because of the wet adhesive strength of the solder, all components get fixed in place on the circuit board 15, and the circuit board 15 can be transported immediately following the populating. Consequently, it is possible to transport the circuit boards 15 on conveyor belts during the entire manufacturing process. Vibrations inherent in this method of transporting do not lead to displacement or loss of the components. Possibly required other process steps can be immediately executed.

The populated circuit board 15 is then brought into an oven, preferably a reflow solder oven, where heat produces the solder connections to the SMD-components and the contact sleeve 17. Because of the wet adhesive strength of the solder, this can occur using a conveyor belt immediately following the populating of the circuit board 15 with the components. In the oven, a temperature cycle is followed that produces an electrical and mechanical solder connection between each component and the circuit board 15.

Figure 4:
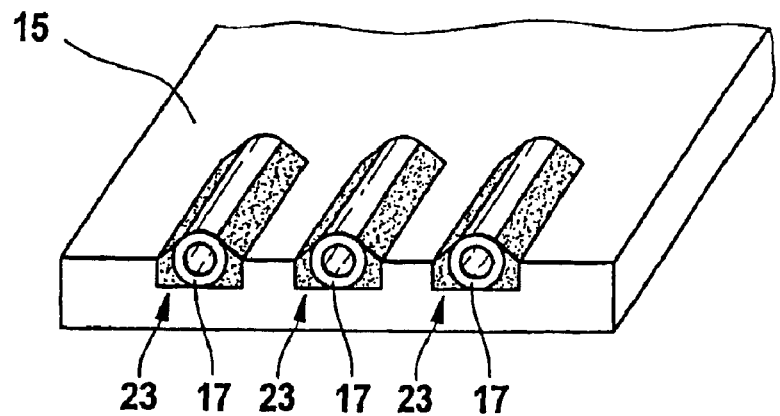
FIG. 4 shows schematically a circuit board with three contact sleeves applied and connected according to the invention.
Figure 5:
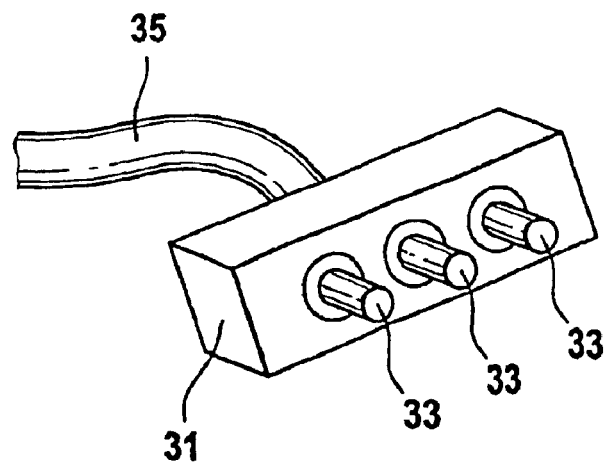
FIG. 5 shows schematically a matching plug with three contacts.

FIG. 4 shows schematically a circuit board 15 with three mounted and connected contact sleeves 17 of the invention, and FIG. 5 a matching plug 31 with three contacts 33. The contacts 33 are e.g. metal pins that are connected internally in the plug 31 with wires of a cable 35. The three contact sleeves 17 are arranged alongside one another and end flush with an outer edge of the circuit board 15.

A number of contact sleeves 17 to be arranged alongside one another can be collected together in a carrier tape, exactly as is done for SMD-resistances and placed on the circuit board 15 with a populating machine.

The circuit board 15 can e.g. be placed in a housing (not shown in FIG. 4) such that the contact sleeves 17 are accessible outside of the housing through corresponding openings in the housing. As the plug 31 is placed against the housing, the contacts 33 enter into the contact sleeves 17 and effect an electrical connection.

What is claimed is:

1. A circuit board having:
   an upper side with a recess provided therein;
   a conductor path extending on the circuit board;
   metallizing bordering said recess, said metallizing being connected to said conductor path; and
   a contact sleeve set in said recess, said contact sleeve being both mechanically secured and electrically connected to said metallizing by means of a solder connection.

2. The circuit board as defined in claim 1, wherein said recess is milled into the circuit board.

3. The circuit board as defined in claim 1, wherein said metallizing is formed by copper pads bordering said recess.

4. The circuit board as defined in claim 1, wherein said metallizing is a metallic coating applied to the surface of said recess and an area adjacent thereto.

5. A method for producing a circuit board having:
   an upper side with a recess provided therein;
   a conductor path extending on the circuit board;
   metallizing bordering said recess, said metallizing being connected to said conductor path; and
   a contact sleeve set in said recess, said contact sleeve being both mechanically secured and electrically connected to said metallizing by means of a solder connection, the method comprising the steps of:
   placing the contact sleeve on the circuit board together with SMD-components with an automatic populating machine; and
   bringing the populated circuit board into an oven, where solder connections for the SMD-components and the contact sleeve are produced by the action of heat.

\* \* \* \* \*